(12) United States Patent
Osawa et al.

(10) Patent No.: US 7,939,351 B2
(45) Date of Patent: May 10, 2011

(54) PRODUCTION METHOD FOR NITRIDE SEMICONDUCTOR LIGHT EMITTING DEVICE

(75) Inventors: Hiroshi Osawa, Chiba (JP); Takashi Hodota, Ichihara (JP)

(73) Assignee: Showa Denko K.K., Tokyo (JP)

( * ) Notice: Subject to any disclaimer, the term of this patent is extended or adjusted under 35 U.S.C. 154(b) by 535 days.

(21) Appl. No.: 12/066,575

(22) PCT Filed: Sep. 14, 2006

(86) PCT No.: PCT/JP2006/318658
§ 371 (c)(1),
(2), (4) Date: Mar. 12, 2008

(87) PCT Pub. No.: WO2007/032546
PCT Pub. Date: Mar. 22, 2007

(65) Prior Publication Data
US 2010/0136727 A1   Jun. 3, 2010

Related U.S. Application Data

(60) Provisional application No. 60/721,590, filed on Sep. 29, 2005.

(30) Foreign Application Priority Data

Sep. 16, 2005   (JP) ................................. 2005-270565

(51) Int. Cl.
*H01L 21/00* (2006.01)
(52) U.S. Cl. ............................. 438/29; 438/605; 257/98
(58) Field of Classification Search .................... 438/29, 438/33, 46, 47, 604, 605; 257/98, 99
See application file for complete search history.

(56) References Cited

U.S. PATENT DOCUMENTS

| | | | |
|---|---|---|---|
| 6,100,104 A | 8/2000 | Haerle | |
| 6,562,648 B1 * | 5/2003 | Wong et al. | 438/46 |
| 7,432,119 B2 * | 10/2008 | Doan | 438/33 |
| 2003/0189215 A1 * | 10/2003 | Lee et al. | 257/94 |
| 2004/0248377 A1 | 12/2004 | Yoo et al. | |
| 2005/0079642 A1 * | 4/2005 | Tamura | 438/22 |

FOREIGN PATENT DOCUMENTS

| | | |
|---|---|---|
| CN | 1649178 A | 8/2005 |
| JP | 09008403 A | 1/1997 |
| JP | 09-055536 A | 2/1997 |
| JP | 11-154648 A | 6/1999 |
| JP | 11-177138 A | 7/1999 |
| JP | 2001-313422 A | 11/2001 |
| JP | 2002-198569 A | 7/2002 |
| JP | 3511970 B2 | 1/2004 |
| JP | 2004-047704 A | 2/2004 |
| JP | 2004-363532 A | 12/2004 |
| JP | 2005-522873 A | 7/2005 |
| KR | 10-2005-0013989 A | 2/2005 |
| KR | 1020050012729 A | 2/2005 |
| WO | 2007/032546 A1 | 3/2007 |

\* cited by examiner

*Primary Examiner* — Kiesha R Bryant
*Assistant Examiner* — Mark W Tornow
(74) *Attorney, Agent, or Firm* — Sughrue Mion, PLLC

(57) ABSTRACT

The present invention provides a production method for a nitride semiconductor light emitting device, which warps less after removing the substrate, and which can emit light from the side thereof; specifically, the present invention provides a production method for a nitride semiconductor light emitting device comprising: forming stacked layers by stacking at least an n-type semiconductor layer, a light emitting layer, and a p-type semiconductor layer on a substrate in this order; forming grooves which divide the stacked layers so as to correspond to nitride semiconductor light emitting devices to be produced; filling the grooves with a sacrifice layer; and forming a plate layer on the p-type semiconductor layer and the sacrifice layer by plating.

15 Claims, 1 Drawing Sheet

PRODUCTION METHOD FOR NITRIDE SEMICONDUCTOR LIGHT EMITTING DEVICE

CROSS-REFERENCE TO RELATED APPLICATIONS

This application claims the benefit pursuant to 35 U.S.C. §119 (e) of U.S. Provisional Application No. 60/721,590 filed on Sep. 29, 2005, and priority is claimed on Japanese Patent Application No. 2005-270565 filed on Sep. 16, 2005, and U.S. Provisional Application No. 60/721,590 filed on Sep. 29, 2005, the contents of which are incorporated herein by reference.

TECHNICAL FIELD

The present invention relates to a production method for a nitride semiconductor light emitting device, and in particular, to a production method for a nitride semiconductor light emitting device which is obtained by removing a substrate, which comprises electrodes on the upper and lower surfaces thereof, and which has high reliability and improved light emitting efficiency.

BACKGROUND ART

In recent years, GaN compound semiconductor material has received much attention as semiconductor material used for short wavelength light emitting devices. A GaN compound semiconductor is formed on an oxide substrate such as a sapphire single crystal substrate, or Group III-V compound substrates by a metalorganic chemical vapor deposition method (MOCVD method) or a molecular beam epitaxy method (MBE method).

A sapphire single crystal substrate has a lattice constant which differs from the lattice constant of GaN by 10% or more. However, since a nitride semiconductor having excellent properties can be formed by forming on a sapphire single crystal substrate, a buffer layer comprising MN or AlGaN, a sapphire single crystal substrate is widely used. For example, when a sapphire single crystal substrate is used, an n-type semiconductor layer, a light emitting layer, and a p-type semiconductor layer are formed on the sapphire single crystal substrate in this order. Since a sapphire single crystal substrate is insulant, in general, in a device comprising a sapphire single crystal substrate, both a positive electrode formed on the p-type semiconductor layer and a negative electrode formed on an n-type semiconductor layer are positioned on one side of the device. Examples of a method for extracting light from a device comprising positive and negative electrodes on one side includes a face-up method in which light is extracted from the p-type semiconductor side using a transparent electrode such as ITO as a positive electrode, and a flip-chip method in which light is extracted from the sapphire substrate side using a highly reflective film such as Ag as a positive electrode.

As is explained above, sapphire single crystal substrates are widely used. However, since sapphire is insulant, a sapphire single crystal substrate has some problems. First of all, in order to form the negative electrode, the n-type semiconductor is exposed by etching the light emitting layer; therefore, the area of light emitting layer is reduced by the area of the negative electrode, and output power decreases. Secondly, since the positive electrode and the negative electrode are positioned on the same side, electrical current flows horizontally, current density is increased locally, and the device generates heat. Thirdly, since heat conductivity of a sapphire substrate is low, generated heat is not diffused, and the temperature of the device increases.

In order to solve these problems, a method is used in which a conductive substrate is attached to a device comprising an n-type semiconductor layer, a light emitting layer, and a p-type semiconductor layer which are stacked on a sapphire single crystal substrate in this order, the sapphire single crystal substrate is removed, and then a positive electrode and a negative electrode are positioned on both sides of the resulting stacked layers (For example, Japanese Patent (Granted) Publication No 3511970).

In addition, the conductive substrate is formed by plating, not by attaching (For example, Japanese Unexamined Patent Application, First Publication 200-47704).

DISCLOSURE OF INVENTION

Examples of a method for attaching a conductive substrate include a method in which metal compounds having a low melting point such as AuSn are used as an adhesive, or an activation junction method in which a surface to be joined is activated by argon plasma under vacuum. These methods require that the surface to be attached be extremely flat and smooth. Therefore, if there is foreign matter such as particles on the surface to be attached, the area is not closely attached. Due to this, it is difficult to obtain a uniformly attached surface.

On the other hand, since the thickness of the n-type semiconductor layer stacked on the sapphire substrate, that is, a GaN layer, is in a range from 1 to 10 μm, and the temperature of the stacking layer is high such as about 1,000° C., the GaN layer has extremely high film stress. Specifically, when a GaN layer having a thickness of 5 μm is stacked on a sapphire substrate having a thickness of 0.4 mm, the GaN layer warps at about 50 to 100 μm.

In addition, when a conductive substrate is formed on the p-type semiconductor layer by plating, since the mechanical strength of the conductive substrate is smaller than that of the sapphire substrate, and the thickness of the conductive substrate is limited to a range from 10 μm to 200 μm from the view point of productivity, after removing the sapphire substrate, warpage of stacked layers becomes larger.

In order to decrease the adverse effects of warpage generated in the GaN layer stacked on the sapphire substrate, it is effective to divide the GaN layer. Stress applied to the GaN layer is released into the divided portions, and warpage applied to the entire conductive substrate is also released, and high reliability can be obtained.

As is explained above, when the conductive plate substrate is formed after dividing the GaN layer, that is, after removing the sapphire substrate, the GaN layer is divided, and the conductive substrate is formed on the p-type semiconductor layer, it is possible to decrease warpage of the entire conductive substrate, but the following two problems arise.

(1) Since the GaN layer, that is, the n-type semiconductor layer, is exposed, when the conductive substrate is formed by plating, the n-type semiconductor layer and the p-type semiconductor layer short.

(2) Material used for plating to form the conductive substrate is immersed into the exposed side surfaces of the p-type semiconductor layer, the light emitting layer, and the n-type semiconductor layer, and it is impossible to emit light effectively from the sides of the device.

The problem (1) is easily solved by forming a protective film on the side surfaces of the p-type semiconductor layer, the light emitting layer, and the n-type semiconductor layer.

However, it is difficult to solve the problem (2) by only forming a protective film on the side surfaces of these layers.

In consideration of the above-described problems, it is an object of the present invention to provide a production method for a nitride semiconductor light emitting device, which has small wrap after removing the substrate consequently having high reliability, and from the sides of which light can be emitted efficiently.

As a result of conducting diligent research that focused on solving these problems, the present inventors found that it is possible to prevent material used for plating from permeating into the side surfaces of stacked layers comprising at least an n-type semiconductor layer, a light emitting layer, and a p-type semiconductor layer by forming grooves in the stacked layers so as to form nitride semiconductor light emitting devices, and filling the grooves with a sacrifice layer which is removed after forming a plate layer, that a device from which light is efficiently emitted from the side surfaces thereof is formed by removing the sacrifice layer after plating, and that warpage caused by removing substrate can be decreased. That is, the present invention provides the following production methods for a nitride semiconductor light emitting device.

(1) A production method for a nitride semiconductor light emitting device comprising forming stacked layers by stacking at least an n-type semiconductor layer, a light emitting layer, and a p-type semiconductor layer on a substrate in this order; forming grooves which divide the stacked layers so as to correspond to nitride semiconductor light emitting devices to be produced; filling the grooves with a sacrifice layer; and forming a plate layer on the p-type semiconductor layer and the sacrifice layer by plating.

(2) The production method for a nitride semiconductor light emitting device according to (1), wherein the production method further comprises a step for removing the sacrifice layer.

(3) The production method for a nitride semiconductor light emitting device according to (1), wherein a metallic layer is formed on the p-type semiconductor layer before forming the plate layer.

(4) The production method for a nitride semiconductor light emitting device according to (1), wherein a buffer layer is formed on the substrate before forming the stacked layers, and the substrate and the buffer layer are removed after forming the plate layer.

(5) The production method for a nitride semiconductor light emitting device according to (3), wherein the metallic layer which is formed only on the p-type semiconductor layer is formed before filling the grooves with the sacrifice layer.

(6) The production method for a nitride semiconductor light emitting device according to (4), wherein the substrate is removed by laser.

(7) The production method for a nitride semiconductor light emitting device according to (1) or (2), wherein the sacrifice layer is made of resist material.

(8) The production method for a nitride semiconductor light emitting device according to (3), wherein the metallic layer comprises an ohmic contact layer.

(9) The production method for a nitride semiconductor light emitting device according to (3), wherein the metallic layer comprises a reflection layer.

(10) The production method for a nitride semiconductor light emitting device according to (3), wherein the metallic layer comprises an adhesion layer which contacts a layer formed on the adhesion layer and a layer formed under the adhesion layer.

(11) The production method for a nitride semiconductor light emitting device according to (8), wherein the ohmic contact layer is made of at least one selected from the group consisting of Pt, Ru, Os, Rh, Ir, Pd, Ag, and alloys thereof.

(12) The production method for a nitride semiconductor light emitting device according to (9), wherein the reflection layer is made of a Ag alloy or an Al alloy.

(13) The production method for a nitride semiconductor light emitting device according to (10), wherein the adhesion layer is made of at least one selected from the group consisting of Ti, V, Cr, Zr, Nb, Mo, Hf, Ta, W, and alloys thereof.

(14) The production method for a nitride semiconductor light emitting device according to (1) or (2), wherein a thickness of the plate layer is in a range from 10 μm to 200 μm.

(15) The production method for a nitride semiconductor light emitting device according to (1) or (2), wherein the plate layer is made of a NiP alloy, Cu, or a Cu alloy.

(16) The production method for a nitride semiconductor light emitting device according to (1) or (2), wherein after forming the plate layer, an obtained product is annealed in a range from 100° C. to 300° C.

(17) The production method for a nitride semiconductor light emitting device according to (3), wherein a plate adhesion layer is formed between the metallic layer and the plate layer so as to contact the plate layer.

(18) The production method for a nitride semiconductor light emitting device according to (17), wherein the plate adhesion layer comprises 50% by weight or more of a same component as a main component which is a ratio is 50% by weight or more of an alloy contained in the plate layer.

(19) The production method for a nitride semiconductor light emitting device according to (17) or (18), wherein the plate adhesion layer is made of a NiP alloy or a Cu alloy.

BEST MODE FOR CARRYING OUT THE INVENTION

The embodiments of the present invention will be explained with references to the figures. However, the present invention is not limited to the following embodiments and, for example, may be a combination of the following embodiments.

Figure 1:
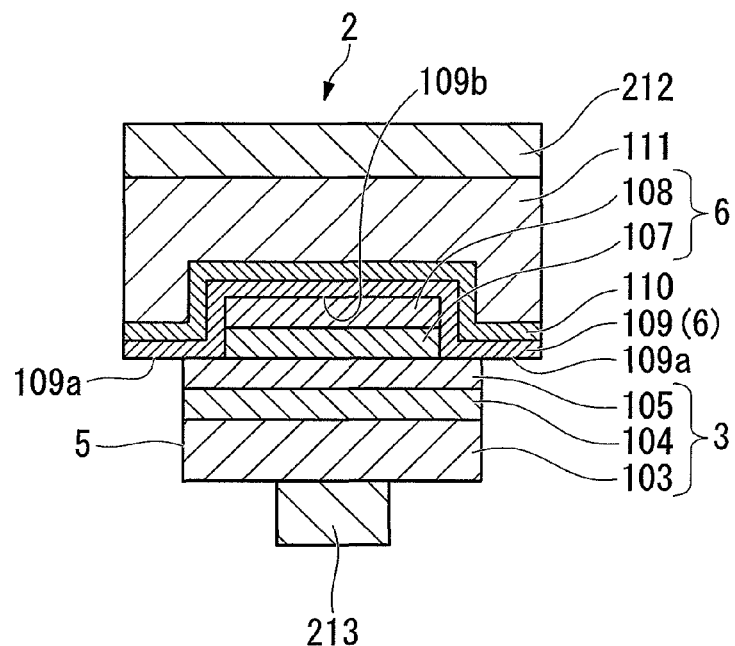
FIG. 1 is a view showing a cross-sectional structure of the nitride semiconductor light emitting device of the present invention.
Figure 2:
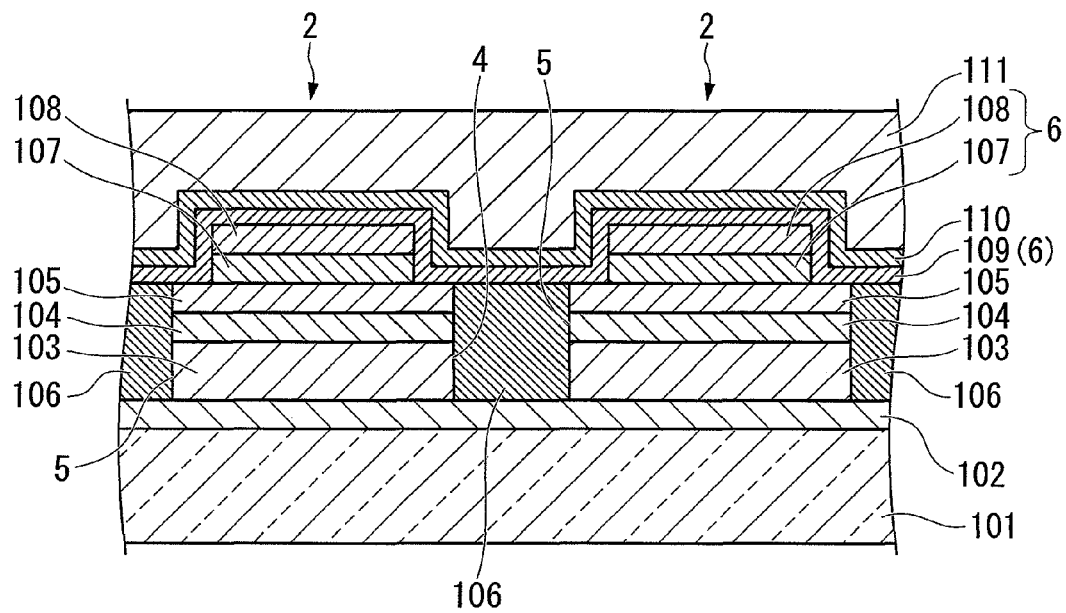
FIG. 2 is a view for explaining a production method for a nitride semiconductor light emitting device of the present invention.

FIG. 1 is a view showing a cross-sectional structure of the nitride semiconductor light emitting device of the present invention. FIG. 2 is a view for explaining a production method for a nitride semiconductor light emitting device of the present invention. Moreover, in FIG. 2, in order to facilitate visualization, out of a plurality of nitride semiconductor light emitting devices, only two nitride semiconductor light emitting devices are shown.

The nitride semiconductor light emitting device (below, abbreviated as "light emitting device") 2 shown in FIG. 1 comprises nitride semiconductor layers ("semiconductor stacked layers") 3 comprising an n-type semiconductor layer 103, a light emitting layer 104, and a p-type semiconductor layer 105. The sides 5 of the semiconductor stacked layers 3 are exposed, and at the center part of the p-type semiconductor layer 105 included in the semiconductor stacked layers 3, that is, at the center of the top surface of the semiconductor stacked layers 3 in FIG. 1, an ohmic contact layer 107 and a reflection layer 108 and an adhesion layer 109, which constitute a metal layer 6, are formed in this order. The adhesion layer 109 comprises a cover portion 109b which is formed on the reflection layer 108, the sides of the ohmic contact layer 107 and the reflection layer 108, and the peripheral portion of the top surface of the p-type semiconductor layer 105, and a flange portion 109a which continuously connects with the cover portion 109b and extends from the edge of the p-type semiconductor layer 105 toward the outside of the semiconductor stacked layers 3. On the adhesion layer 109, a plate layer 111 is formed via the adhesion layer for the plate layer (abbreviated as "plate adhesion layer") 110. In addition, a positive electrode 212 is formed on the upper surface of the plate layer 111, and a negative electrode 213 is formed on the lower surface of the n-type semiconductor layer 103.

In order to produce the light emitting device 2 shown in FIG. 1, first, the substrate 101 is prepared, and the buffer layer 102 is formed on the substrate 101, as is shown in FIG. 2.

Examples of material for the substrate 101 include oxide single crystals such as sapphire single crystal ($Al_2O_3$; A plane, C plane, M plane, and R plane), spinel single crystal ($MgAl_2O_4$), ZnO single crystal, $LiAlO_2$ single crystal, $LiGaO_2$ single crystal, and MgO single crystal; and conventional substrate material such as Si single crystal, SiC single crystal, and GaAs single crystal. These materials can be used for the substrate 101 without any limitation. When a conductive substrate such as a substrate made of SiC is used as the substrate 101, it is not necessary to remove the substrate 101 when producing a light emitting device 2 comprising positive and negative electrodes 212 and 213 on both surfaces thereof. However, since a buffer layer 102, which is insulating, cannot be used, and crystals of the semiconductor stacked layers 3 grown on the buffer layer 102 are degraded, a light emitting device 2 having excellent properties cannot be produced. Therefore, it is necessary to remove the substrate 101 even when conductive SiC or Si is used for the substrate 101 in the present invention.

The buffer layer 102 is formed to improve the crystallinity of the n-type conductive layer 103. Specifically, the lattice constant of sapphire single crystal and the lattice constant of GaN single crystal differ by 10% or more. When a buffer layer 102 made of GaN is formed on a substrate made of sapphire single crystal, the crystallinity of GaN constituting the n-type semiconductor layer 103 can be improved by forming the buffer layer 102 from AlN or AlGaN, which has a lattice constant between the lattice constants of sapphire single crystal constituting the substrate 101 and GaN single crystal constituting the n-type semiconductor layer 103.

Then, at least the n-type semiconductor layer 103, the light emitting layer 104, and the p-type semiconductor layer 105 are formed in this order on the buffer layer 102 to produce the semiconductor stacked layers 3 having a hetero junction structure.

As semiconductor used for a semiconductor stacked layers 3, many nitride semiconductors denoted by the general formula: $Al_xIn_yGa_{1-x-y}N$ ($0 \leq x < 1$, $0 \leq y < 1$, and $x+y<1$) are known. In the present invention, nitride semiconductors denoted by the general formula can be used without any limitation.

Production methods for these nitride semiconductors 3 are not limited. The present invention can use all methods which are known as methods for growing Group-III nitride semiconductors such as a metalorganic chemical vapor deposition method (MOCVD), hydride vapor phase epitaxy (HVPE), and molecular beam epitaxy method (MBE). Among these, from the view point of controllability of the thickness of a film, and mass productivity, MOCVD is preferable.

When MOCVD is used to produce the nitride semiconductor 3, it is preferable that hydrogen ($H_2$) or nitrogen ($N_2$) be used as a carrier gas; that trimethylgallium (TMG) or triethylgallium (TEG) be used as a Ga source which is a group-III source material; that trimethylaluminum (TMA) or triethylaluminum (TEA) be used as an Al source; that trimethylindium (TMI) or triethylindium (TEI) be used as an In source; and that ammonia ($NH_3$) or hydrazine ($N_2H_4$) be used as a N source which is a group-V source material. As an n-type dopant, for example, monosilane ($SiH_4$) or disilane ($Si_2H_6$) is preferably used as a Si source, and germane ($GeH_4$) is preferably used as a Ge source. As a p-type dopant, for example, biscyclopentadienyl magnesium (Cp2Mg) or bisethylcyclopentadienyl magnesium (($EtCp)_2Mg$) is used as a Mg source.

As is shown in FIG. 2, grooves 4 are formed on the substrate 101 to divide the semiconductor stacked layers 3 so as to correspond to the light emitting devices 2 to be produced. The grooves 4 divide the semiconductor stacked layers 3 so as to correspond to light emitting devices 2, and the bottom of the grooves 4 reach the surface of the buffer layer 102 in FIG. 2. The side surfaces 5 of the semiconductor stacked layers 3 are exposed from the side walls of the grooves 4, and the buffer layer 102 is exposed from the bottom of the grooves 4.

For example, when a sapphire single crystal is used as the substrate 101, the present invention can use any conventional method to divide the semiconductor stacked layers 3 such as an etching method, laser cutting method, and laser lift-off method, without any limitation. However, with respect to the removal of the substrate 101 which is carried out later, it is preferable to use a method for dividing the semiconductor stacked layers 3 which does not damage the sapphire substrate 101. Therefore, when the semiconductor stacked layers 3 is divided by an etching method, it is preferable to select a method which has a faster etching rate for the semiconductor layers 3 and lower for the sapphire substrate 101. When the semiconductor stacked layers 3 is divided using a laser, it is preferable to use a laser having a wavelength in a range from 300 to 400 nm, with respect to the difference between the absorption wavelength of the semiconductor stacked layers 3 and the sapphire substrate 101.

After that, as is shown in FIG. 2, the grooves 4 are filled with the sacrifice layer 106. In the case that the semiconductor stacked layers 3 is divided so as to correspond to the light emitting devices 2, the width of the groove 4, that is, the distance between the isolated semiconductor stacked layers 3, is about 1 to 30 µm, and the depth thereof is about 1 to 10 µm.

It is difficult to use, in a practical manner, film forming methods such as CVD, sputtering, and deposition to fill the grooves 4, because they have a low film forming rate. Consequently, in order to fill the grooves 4, the sacrifice layer 106 is formed, that is, the grooves 4 is filled with the material of the sacrifice layer 106 in the present invention.

It is preferable that the sacrifice layer 106 be formed by material which does not damage the semiconductor stacked layers 3, the adhesion layer 109, and the plate layer 111 when removing the sacrifice layer 106. Preferable examples of material constituting the sacrifice layer 106 include resist material, resin, and ceramics. In particular, since resist material fills selectively the grooves 4 by developing, and is easily removed by using an exclusive release agent, resist material is more preferable. Ceramics are also more preferable because $SiO_2$ is easily removed by HF. Among $SiO_2$, spin-on-glass (SOG) material is more preferable, because it can closely fill the grooves 4.

As a method for producing the sacrifice layer 106, any conventional method such as a spin coating method, spray method, and dip coating method are used. In particular, with respect to productivity, a spin coating method is preferable.

Then, as shown in FIG. 2, the metal layer 6 comprising the ohmic contact layer 107, the reflection layer 108, and the adhesion layer 109 is formed on the p-type semiconductor layer 105.

In order to form the metal layer 6 on the p-type semiconductor layer 105, first, the ohmic contact layer 107 is formed at the center of the p-type semiconductor layer 105.

The ohmic contact layer 107 is required to have a low contact resistance to the p-type nitride semiconductor layer 105. With respect to the contact resistance to the p-type nitride semiconductor layer 105, an element of the platinum group such as Pt, Ru, Os, Rh, Ir, and Pd or Ag, or an alloy thereof is preferable as material for the ohmic contact layer 107. Among these, Pt, Ir, Rh, and Ru are more preferable, and Pt is most preferable. When Ag is used for the ohmic contact layer 107, excellent reflectivity is obtained. However, there is a problem that the contact resistance of Ag is higher than that of Pt. Therefore, Pt is the most preferable material for the ohmic contact layer 107. However, Ag can be used in devices in which a high contact resistance is not required.

To stably obtain a low contact resistance, the thickness of the ohmic contact layer 107 is preferably 0.1 nm or greater, and more preferably 1 nm or greater. In particular, when the thickness of the ohmic contact layer 107 is 1 nm or greater, a uniform contact resistance can be obtained.

Then, the reflection layer 108 is formed on the ohmic contact layer 107 to improve the reflectivity of light. The reflection layer 108 is preferably made of a Ag alloy, or an Al alloy. A Ag alloy has a higher reflectivity than Pt, Ir, Rh, Ru, Os, and Pd in the visible to ultraviolet wavelengths. That is, since light from the light emitting layer 104 is sufficiently reflected, a high-powered device can be produced using the reflection layer made of a Ag alloy or Al alloy. In addition, when the reflection layer 108 is made of a Ag alloy or a n Al alloy, and the ohmic contact layer 107 is made thin enough for light to pass sufficiently through, sufficient reflected light can be obtained in addition to obtaining an excellent ohmic contact. Therefore, a high-powered light emitting device 2 can be produced.

The thickness of the ohmic contact layer 107 is preferably 30 nm or less, and more preferably 10 nm or less. As the method for producing the ohmic contact layer 107 and the reflection layer 108, conventional sputtering methods and deposition methods can be used without any limitation.

Moreover, when the sacrifice layer 106 is made of resist material, before filling the grooves 4 with resist material, it is preferable to form the metal layer 6 by patterning. In particular, it is more preferable that the ohmic contact layer 107 and the reflection layer 108, which are formed only on the p-type semiconductor layer 105, be formed before filling the grooves 4 with resist material. The reason is that since resist material is used to pattern, if the grooves 4 were filled with resist material, the resist material filling the grooves 4 would be peeled by patterning.

Then, as is shown in FIG. 2, the adhesion layer 109 is formed so as to cover the side of the ohmic contact layer 107 and the reflection layer 108, the top surface of the reflection layer 108, the peripheral portion of the top surface of the p-type semiconductor layer 105, and the top surface of the sacrifice layer 106. The adhesion layer 109 improves adhesion between a layer formed on the adhesion layer and a layer formed under the adhesion layer. That is, the adhesion layer 109 improves adhesion between the reflection layer 108 and the p-type semiconductor layer 105, and the plate layer 111 in this embodiment. The adhesion layer 109 is made of metal having excellent adhesion to the p-type semiconductor layer 105. Examples of material which may constitute the adhesion layer 109 include Ti, V, Cr, Zr, Nb, Mo, Hf, Ta, and W, and alloys thereof.

Then, the plate adhesion layer 110 is formed on the adhesion layer 109. The plate adhesion layer 110 improves adhesion between the plate layer 111 and the adhesion layer 109. Material comprised in the plate adhesion layer 110 varies depending on the plating material which is used to form the plate layer 111. In order to improve adhesion to the plate layer 111, it is preferable that the plate adhesion layer 110 be made of material comprising 50% by weight or more of the same component as the main component which is 50% by weight or more of the plate layer 111. For example, when the plate layer 111 is made by plating NiP, the plate adhesion layer 110 is preferably made of a Ni alloy, and more preferably made of NiP. In addition, when the plate layer 111 is made by plating Cu, the plate adhesion layer 110 is preferably made of a Cu alloy, and more preferably made of Cu.

In order to obtain excellent adhesion, the thickness of the adhesion layer 109 and the plate adhesion layer 110 is preferably 0.1 nm or greater, and more preferably 1 nm or greater. Although there is no upper limit to the thickness of the adhesion layer 109 and the plate adhesion layer 110, the upper limit of the thickness is preferably 2 nm or less from the point of view of productivity.

The production method for the adhesion layer 109 and the plate adhesion layer 110 is not limited, and examples thereof include a conventional sputtering method and deposition method. Since sputtered particles having high energy hit the surface of a base to form a film in the sputtering method, it is possible to form a film having high adhesion. Therefore, a sputtering method is preferably used to form the adhesion layer 109 and the plate adhesion layer 110.

Then, the plate layer 111 is formed on the plate adhesion layer 110 by a plating method. The plating method comprises both an electroless plating method and an electrolysis plating method. When the plate layer 111 is formed by an electroless plating method, it is preferable to plate a NiP alloy. In contrast, when the plate layer 111 is formed by an electrolysis plating method, it is preferable to plate Cu or a Cu alloy.

In order to maintain enough strength as a plate, the thickness of the plate layer 111 is preferably 10 μm or greater. However, if the plate layer 111 is too thick, the plate layer 111 easily peels and productibility decreases; therefore, the thickness is preferably 200 μm or less.

Before plating, it is preferable to degrease and wash the surface of the plate adhesion layer 110 using widely used neutral detergents. In addition, it is also preferable to chemically etch the surface of the plate adhesion layer 110 using acids such as nitric acid to remove a natural oxide film on the plate adhesion layer 110.

When the plate layer 111 is made by NiP plating, the plate layer 111 is preferably formed by electroless plating using a plating bath comprising a source of nickel such as nickel sulfate and nickel chloride, and a phosphorous source such as hypophosphite. Examples of a suitable commercialized product of a plating bath used in electroless plating include NIMUDEN® HDX marketed by Uemura & Co., Ltd. The pH of the plating bath during electroless plating is preferably in a range from 4 to 10, and the temperature thereof is preferably in a range from 30 to 95° C.

When the plate layer 111 is made by plating Cu or a Cu alloy, the plate layer 111 is preferably formed by electrolysis plating using a plating bath comprising a source of Cu such as copper sulfate. The plating bath during electrolysis plating is preferably strongly acidic, that is, the pH thereof is preferably 2 or less. The temperature thereof is preferably in a range from 10 to 50° C., and more preferably room temperature (25° C.). The current density is preferably in a range from 0.5 to 10 A/dm$^2$, and more preferably in a range from 2 to 4 A/dm$^2$.

In addition, in order to make the surface smooth, a leveling agent is preferably added to the plating bath. Examples of a commercialized product of a leveling agent used include ETN-1-A and ETN-1-B, marketed by Uemura & Co., Ltd.

In order to improve adhesion of the plate layer 111 to the plate adhesion layer 110, it is preferable to anneal the plate layer 111. The annealing temperature is preferably in a range from 100 to 300° C. to improve adhesion. If the annealing temperature is more than 300° C., the adhesion may be further improved, but ohmic properties may be degraded.

After forming the plate layer 111, the substrate 101 is removed together with the buffer layer 102. Examples of a removing method for the substrate 101 include any conventional methods such as polishing, etching, and laser-lift off.

After removing the substrate 101, the buffer layer 102 is removed by polishing, etching, or the like, and the n-type nitride semiconductor layer 103 is exposed.

After that, the sacrifice layer 106 is also removed. As a removing method for the sacrifice layer 106, conventional methods such as a wet-etching method and dry-etching method can be used without any limitation.

Then, the negative electrode 213 is formed on the n-type nitride semiconductor layer 103. As the negative electrode 213, negative electrodes having various compositions and structures are known. In the present invention, conventional negative electrodes can be used without any limitation.

As the positive electrode 212 formed on the plate layer 111, various positive electrodes comprising Au, Al, Ni, Cu, and the like are known. In the present invention, conventional positive electrodes can be used without any limitation.

The light emitting device 2 as is shown in FIG. 1 is obtained by cutting the plate layer 111, the plate adhesion layer 110, and the adhesion layer 109.

EXAMPLES

Below, the production method for a nitride semiconductor light emitting device 2 according to the present invention will be explained with reference to Examples and Comparative Examples. Moreover, the present invention is not limited to the following examples.

Example 1

The nitride semiconductor light emitting device as is shown in FIG. 1 was produced by the following processes.

As is shown in FIG. 2, on a sapphire substrate 101, a buffer layer 102 made of AlN having a thickness of 10 nm and a semiconductor stacked layers 3 were formed. The semiconductor stacked layers 3 was formed by forming a Si-doped n-type GaN contact layer having a thickness of 5 μm; an n-type In$_{0.1}$Ga$_{0.9}$N cladding layer (an n-type semiconductor layer 103) having a thickness of 30 μm; a light emitting layer 104 having a multi-well structure in which a Si-doped n-type GaN barrier layer having a thickness of 30 nm and an In$_{0.2}$Ga$_{0.8}$N well layer having a thickness of 2.5 nm were stacked five times and then the barrier layer was stacked; a Mg-doped p-type Al$_{0.07}$Ga$_{0.93}$N cladding layer (a p-type semiconductor layer 105) having a thickness of 50 nm; and a Mg-doped p-type GaN contact layer having a thickness of 150 nm were stacked successively on the buffer layer 102.

Then, grooves 4 were formed by dry etching in the semiconductor stacked layers 3 such that the grooves 4 reached the buffer layer 102 to divide the semiconductor stacked layers 3 so as to correspond to each light emitting device 2 to be produced. After that, a metal layer 6 comprising an ohmic contact layer 107 and a reflection layer 108 was formed. That is, an ohmic contact layer 107, which is a Pt layer having a thickness of 1.5 nm, was formed by sputtering on the p-type GaN contact layer included in the semiconductor stacked layers 3. Then, a reflection layer 108, which is a Ag layer having a thickness of 20 nm, was formed by sputtering on the ohmic contact layer 107. Pt and Ag patterns were formed by conventional photolithography and lift off techniques.

After that, the grooves 4 dividing the semiconductor stacked layers 3 were filled with a sacrifice layer 106 composed of resist material. Resist material, of which the trade name is AZ5214 and which is marketed by Clariant Corporation, was used. After filling the grooves 4 with the resist material, a pre-baking was performed at 110° C. for 30 minutes, then the sacrifice layer 106 was exposed and developed, and it was subjected to a post-baking at 110° C. for 15 minutes. After that, an adhesion layer 109, which is a Cr layer having a thickness of 20 nm, was formed by sputtering. A plate adhesion layer 110, which is a film made of NiP alloy (Ni: 80 at %, P: 20 at %) having a thickness of 30 nm was formed by sputtering.

The surface of the plate adhesion layer 110 was immersed in a nitric acid solution (5N) at 25° C. for 30 seconds to remove an oxide film formed on the surface of the plate adhesion layer 110.

Then, a plate layer 111 which is a film made of a NiP alloy having a thickness of 50 μm was formed on the adhesion layer 110 by an electroless plating method using a plating bath (NIUMUDEN® HDX-7G, marketed by Uemura & Co., Ltd.). The electroless plating was performed under conditions in which the pH was 4.6, the temperature was 90° C., and the treatment time was 3 hours. After the plate layer 111 was washed with water and dried, it was annealed at 250° C. for 1 hour using a clean oven. After that, the substrate 101 and the buffer layer 102 were removed by a laser lift-off method to expose the n-type semiconductor layer 103.

Then, the sacrifice layer 106 was removed by using N-methyl-2-pyrrolidone (NMP) as a remover. An ITO film (SnO$_2$: 10% by mass) having a thickness of 400 nm was formed on the n-type semiconductor layer 103 by deposition. Then, a negative electrode 213 comprising a Cr film having a thickness of 40 nm, a Ti film having a thickness of 100 nm, and a Au film having a thickness of 1,000 nm was formed on the center of the surface of the ITO by deposition. The pattern of the negative electrode 213 was formed by conventional photolithography and lift off technologies.

On the surface of the plate layer 111, a positive electrode 212 comprising a Au film having a thickness of 1,000 nm was formed by deposition. Then, the plate layer 111 was divided into the nitride semiconductor light emitting devices 2 shown in FIG. 1 having a 350 μm×350 μm size by dicing.

The resulting nitride semiconductor light emitting device 2 was installed in a TO-18 metal package, and the output power for 20 mA of input current was measured using a tester. The output power of the light emitting device in this example was 18 mW.

Example 2

A nitride semiconductor light emitting device was prepared in a manner identical to that of Example 1, except that the plate adhesion layer 110 having a thickness of 30 nm was formed by sputtering Cu instead of the NiP alloy film, and the plate layer 111 having a thickness of 50 μm was formed by electrolysis plating Cu instead of electroless plating a NiP alloy.

Moreover, electrolysis plating of Cu for obtaining the plate layer 111 was performed under conditions in which a plating bath comprising 80 g/L of $CuSO_4$, 200 g/L of sulfuric acid, and a leveling agent (marketed by Uemura & Co., Ltd., 1.0 mL/L of ETN-1-A, and 1.0 mL/L of ETN-1-B) was used, the current density was 2.5 $A/cm^2$, the temperature was room temperature, the plating time was 3 hours, and material containing copper phosphate was used as an anode.

The resulting nitride semiconductor light emitting device 2 was installed in a TO-18 metal package, and the output power for 20 mA of input current was measured using a tester. The output power of the light emitting device in this example was 18 mW.

Comparative Example

A comparative nitride semiconductor light emitting device was prepared in a manner identical to that of Example 1, except that a $SiO_2$ film having a thickness of 100 nm was formed by a CVD method on the side surfaces of the semiconductor stacked layers 3, where are exposed to the grooves 4.

The resulting nitride semiconductor light emitting device 2 was installed in a TO-18 metal package, and the output power for 20 mA of input current was measured using a tester. The output power of the light emitting device in this example was 12 mW.

It is clear from these results that since permeation of the material used in plating the semiconductor stacked layers 3 into the sides 5 of the semiconductor stacked layers 3 was prevented by filling resist material into the grooves 4, that is, forming the sacrifice layer 106, light can be emitted from the sides 5 of the semiconductor stacked layers 3 after removing the sacrifice layer 106. Therefore, high output power such as 18 mW was obtained in Example 1. Similarly, in the nitride semiconductor light emitting device 2 in Example 2 comprising the plate layer 111 made of Cu, high output power such as 18 mW was obtained.

In contrast, since the material used in plating the semiconductor stacked layers 3 permeates the sides 5 of the semiconductor stacked layers 3, sufficient light could not be emitted from the sides 5 of the semiconductor stacked layers 3. Thereby, the output power was low such as 12 mW.

INDUSTRIAL APPLICABILITY

The nitride semiconductor light emitting device produced by the production method of the present invention has excellent properties and stability, and this is suitable for material used for a light emitting diode, lamp, and the like.

The invention claimed is:

1. A production method for a nitride semiconductor light emitting device, the production method comprising:
    forming stacked layers by stacking at least an n-type semiconductor layer, a light emitting layer, and a p-type semiconductor layer on a substrate in this order;
    forming grooves which divide the stacked layers so as to correspond to nitride semiconductor light emitting devices to be produced;
    filling the grooves with a sacrifice layer;
    forming a metallic layer on the p-type semiconductor layer; and
    forming, after forming the metallic layer, a plate layer over the p-type semiconductor layer, the metallic layer, and the sacrifice layer by plating,
    wherein the metallic layer comprises an ohmic contact layer, a reflection layer, and an adhesion layer, formed sequentially,
    the adhesion layer contacts a layer formed on the adhesion layer and a layer formed under the adhesion layer,
    the adhesion layer contacts a top surface of the reflection layer and a peripheral portion of a top surface of the p-semiconductor layer, and
    the adhesion layer is made of metal.

2. The production method for a nitride semiconductor light emitting device according to claim 1, wherein the production method further comprises a step for removing the sacrifice layer after forming the plate layer.

3. The production method for a nitride semiconductor light emitting device according to claim 1, wherein a buffer layer is formed on the substrate before forming the stacked layers, and the substrate and the buffer layer are removed to expose the n-type semiconductor layer after forming the plate layer.

4. The production method for a nitride semiconductor light emitting device according to claim 1, wherein the ohmic contact layer and the reflection layer are formed only on the p-type semiconductor layer and the ohmic contact layer and the reflection layer are formed before filling the grooves with the sacrifice layer.

5. The production method for a nitride semiconductor light emitting device according to claim 3, wherein the substrate is removed by laser.

6. The production method for a nitride semiconductor light emitting device according to claim 1, wherein the sacrifice layer is made of resist material.

7. The production method for a nitride semiconductor light emitting device according to claim 1, wherein the ohmic contact layer is made of at least one selected from the group consisting of Pt, Ru, Os, Rh, Ir, Pd, Ag, and alloys thereof.

8. The production method for a nitride semiconductor light emitting device according to claim 1, wherein the reflection layer is made of a Ag alloy or an Al alloy.

9. The production method for a nitride semiconductor light emitting device according to claim 1, wherein the adhesion layer is made of at least one selected from the group consisting of Ti, V, Cr, Zr, Nb, Mo, Hf, Ta, W, and alloys thereof.

10. The production method for a nitride semiconductor light emitting device according to claim 1, wherein a thickness of the plate layer is in a range from 10 μm to 200 μm.

11. The production method for a nitride semiconductor light emitting device according to claim 1, wherein the plate layer is made of a NiP alloy, Cu, or a Cu alloy.

12. The production method for a nitride semiconductor light emitting device according to claim 1, wherein after forming the plate layer, an obtained product is annealed at a temperature in a range from 100° C. to 300° C.

13. The production method for a nitride semiconductor light emitting device according to claim 1, wherein a plate adhesion layer is formed between the adhesion layer and the plate layer so as to contact the plate layer.

14. The production method for a nitride semiconductor light emitting device according to claim 13, wherein the plate adhesion layer comprises 50% or more by weight of a same component as a main component which is 50% or more by weight of an alloy contained in the plate layer.

15. The production method for a nitride semiconductor light emitting device according to claim 13, wherein the plate adhesion layer is made of a NiP alloy or a Cu alloy.

* * * * *